United States Patent
Chang et al.

(10) Patent No.: US 8,361,639 B2
(45) Date of Patent: Jan. 29, 2013

(54) COATING, ARTICLE COATED WITH COATING, AND METHOD FOR MANUFACTURING ARTICLE

(75) Inventors: Hsin-Pei Chang, Tu-Cheng (TW); Wen-Rong Chen, Tu-Cheng (TW); Huan-Wu Chiang, Tu-Cheng (TW); Cheng-Shi Chen, Tu-Cheng (TW); Chuang Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 180 days.

(21) Appl. No.: 12/968,416

(22) Filed: Dec. 15, 2010

(65) Prior Publication Data

US 2012/0028074 A1 Feb. 2, 2012

(30) Foreign Application Priority Data

Jul. 29, 2010 (CN) .......................... 2010 1 0240051

(51) Int. Cl.
*B32B 9/00* (2006.01)
*C23C 16/00* (2006.01)

(52) U.S. Cl. ................ 428/697; 204/192.1; 204/192.12; 204/192.15; 204/192.16; 427/299; 427/405; 427/419.1; 427/419.7; 428/212; 428/336; 428/469; 428/472; 428/698; 428/699

(58) Field of Classification Search ............... 204/192.1, 204/192.12, 192.15, 192.16; 427/299, 405, 427/419.1, 419.17; 428/212, 336, 469, 472, 428/697, 698, 699
See application file for complete search history.

(56) References Cited

U.S. PATENT DOCUMENTS

| | | | | |
|---|---|---|---|---|
| 6,395,379 | B1 * | 5/2002 | Braendle ....................... | 428/697 |
| 7,901,799 | B2 * | 3/2011 | Feuerstein et al. ............ | 428/698 |
| 7,923,130 | B2 * | 4/2011 | Shibata et al. ................ | 428/472 |

OTHER PUBLICATIONS

Knotek et al "Abrasive resistance and cutting performance of complex PVD coatings" Sufarce Coatings Technology 68/69 (1994) p. 489-493.*

* cited by examiner

*Primary Examiner* — Archene Turner
(74) *Attorney, Agent, or Firm* — Altis Law Group, Inc.

(57) ABSTRACT

A coating includes a nano-composite base comprising a number of films, the films stacked together one after another. Each film includes a nickel-titanium carbonitride layer and a titanium carbonitride layer.

10 Claims, 4 Drawing Sheets

US 8,361,639 B2

COATING, ARTICLE COATED WITH COATING, AND METHOD FOR MANUFACTURING ARTICLE

CROSS-REFERENCE TO RELATED APPLICATIONS

The present application is related to co-pending U.S. patent application 12/968,421, entitled "COATING, ARTICLE COATED WITH COATING, AND METHOD FOR MANUFACTURING ARTICLE", by Zhang et al. This application has the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and a method for manufacturing the articles.

2. Description of Related Art

Physical vapor deposition (PVD) has conventionally been used to form a coating on metal bases of cutting tools or molds. Materials used as this coating material are required to have excellent durability. At present, Titanium nitride (TiN) and Titanium-aluminum nitride (TiAlN) are mainly used as a material satisfying these requirements. However, these coating materials do not have a good adhesion to metal properties and may easily peel off.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
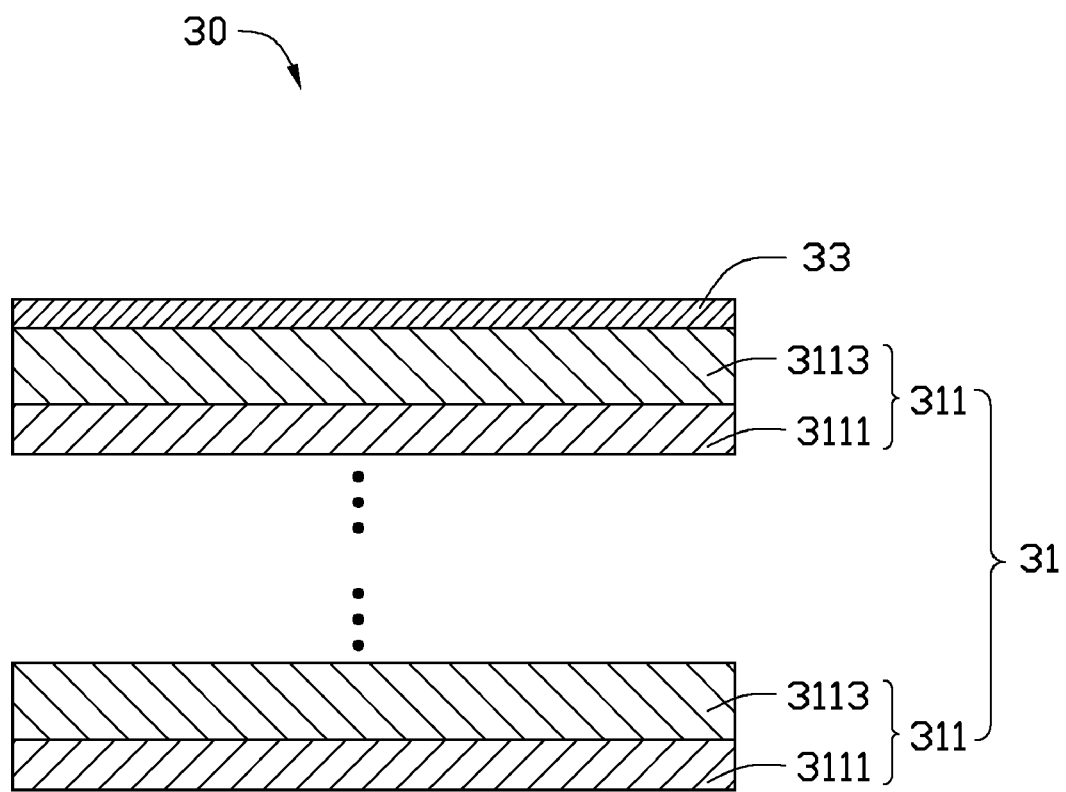
FIG. 1 is a cross-sectional view of an exemplary embodiment of a coating.

A coating 30 includes a nano-composite layer 31, which includes a number of stacked films 311. Each film 311 includes a nickel-titanium carbonitride (NiTiCN) layer 3111 and a titanium carbonitride (TiCN) layer 3113. In other words, the nano-composite layer 31 includes a number of NiTiCN layers 3111 and equal TiCN layers 3113, and each NiTiCN layer 3111 alternate with one TiCN layer 3113. The NiTiCN layers 3111 and the TiCN layers 3113 may be deposited by magnetron sputtering or cathodic arc deposition.

In this exemplary embodiment, the number of the films 311 is about 50~60. Each NiTiCN layer 3111 has a thickness ranging from about 10 nanometers to about 20 nanometers. Each TiCN layer 3113 has a thickness ranging from about 10 nanometers to about 20 nanometers. The coating 30 has a thickness ranging from about 1 micrometer to about 4 micrometers. The coating 30 may also include a color layer 33 covering the nano composite base 31, to decorate the appearance of the coating 30.

Figure 2:
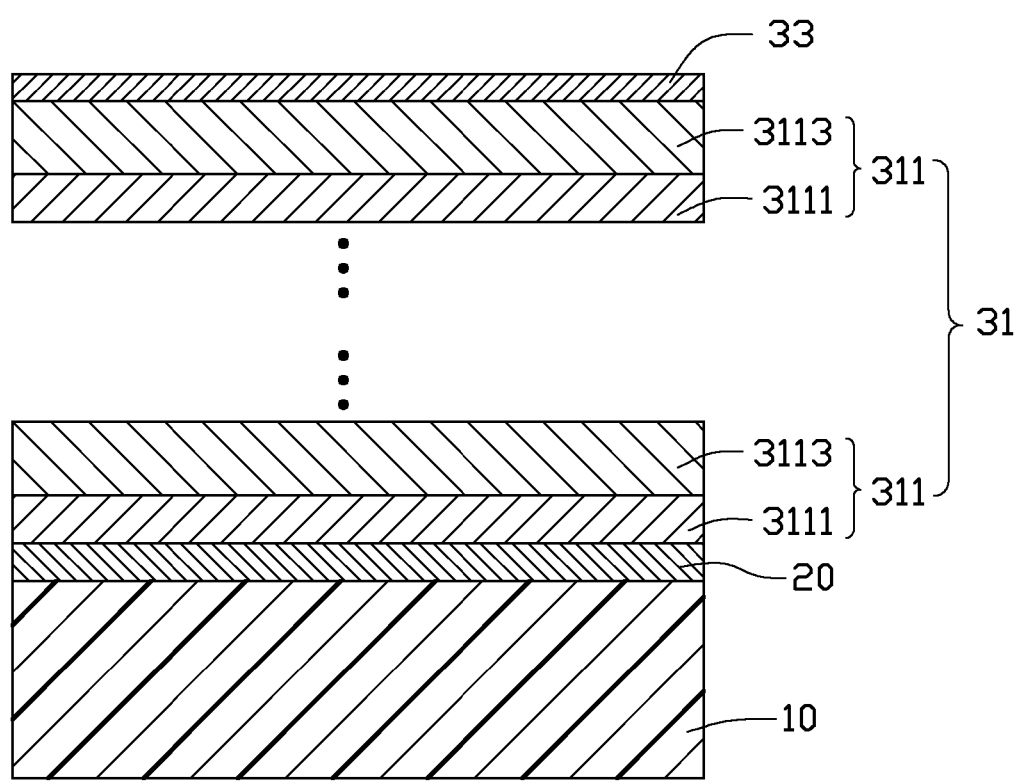
FIG. 2 is a cross-sectional view of an article coated with the coating in FIG. 1.

Referring to FIG. 2, an exemplary article 40 includes a substrate 10, a bonding layer 20 deposited on the substrate 10 and the coating 30 deposited on the bonding layer 20. The substrate 10 is made of metallic element, such as high speed steel, hard alloy, or stainless steel. The article 40 may be a cutting tool, a mold, or housing for electronic devices. The bonding layer 20 is a nickel titanium (NiTi) layer. The bonding layer 20 has a thickness ranging from about 0.05 micrometer to about 0.2 micrometer, and preferably has a thickness of 0.1 micrometer. The bonding layer 20 can be deposited by magnetron sputtering or cathodic arc deposition. The chemical stability of the bonding layer 20 is between the chemical stability of the substrate 10 and the chemical stability of the coating 30, and a coefficient of thermal expansion of the bonding layer 20 is between the coefficient of thermal expansion of the substrate 10 and the coefficient of thermal expansion of the coating 30. Thus, the bonding layer 20 improves binding between the substrate 10 and the coating 30 so the coating 30 can be firmly deposited on the substrate 10.

Figure 3:
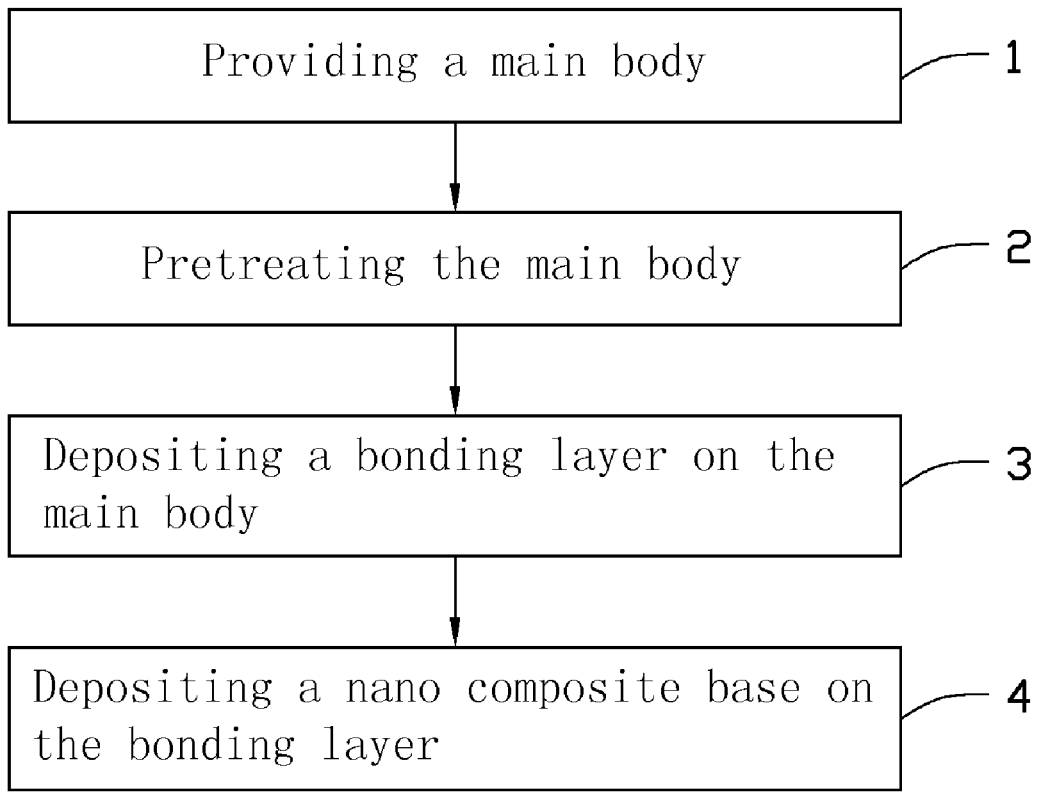
FIG. 3 is a diagram for manufacturing the article in FIG. 2.
Figure 4:
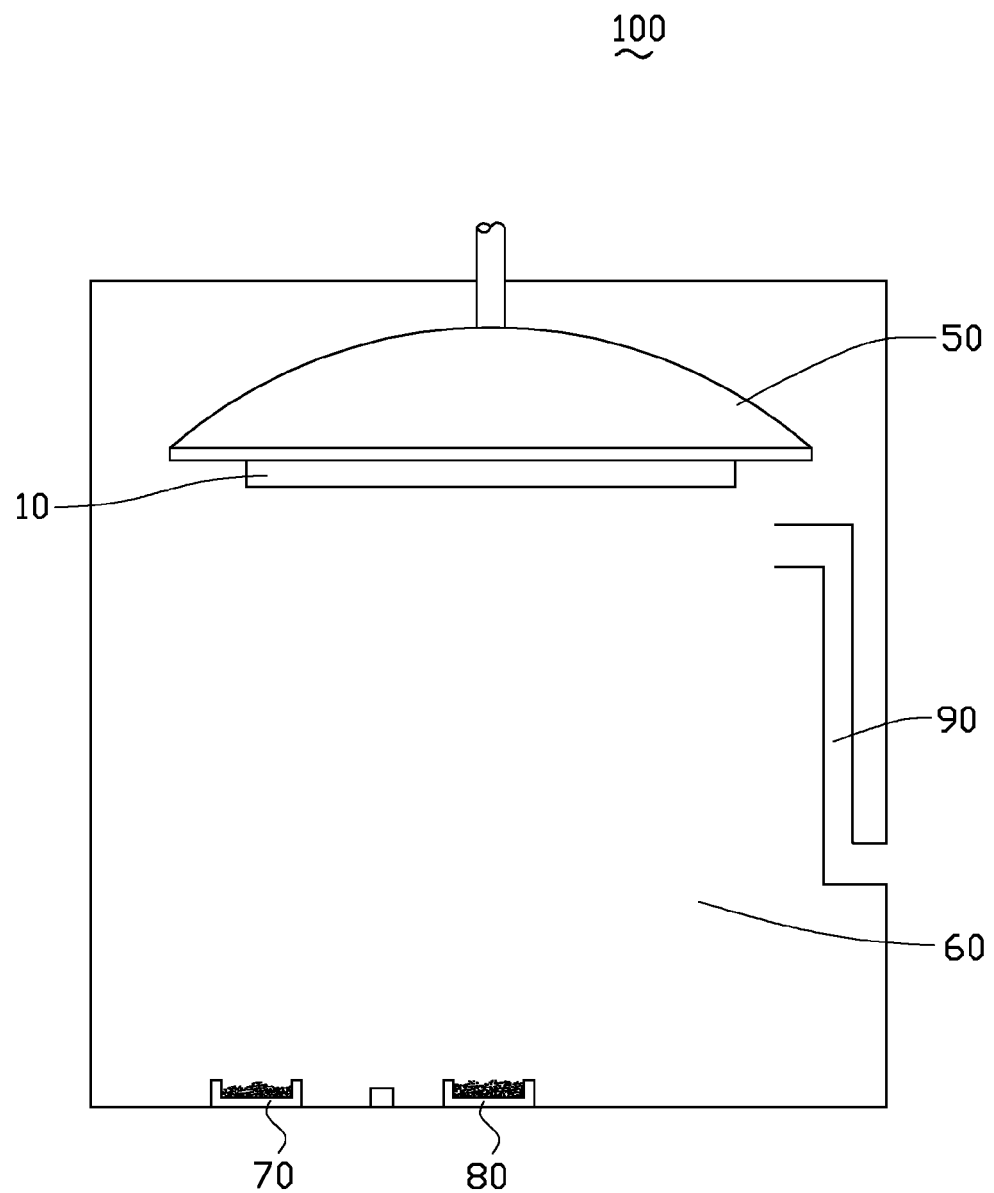
FIG. 4 is a schematic view of a magnetron sputtering coating machine for manufacturing the article in FIG. 2.

Referring to FIG. 3, a method for manufacturing the article 40 includes the following steps.

Step 1 provides the substrate 10. The substrate 10 may be made of high speed steel, hard alloy, or stainless steel.

Step 2 pretreats the substrate 10. First, the substrate 10 is washed with a solution (e.g., Alcohol or Acetone) in an ultrasonic cleaner, to remove, e.g., grease, dirt, and/or impurities. Second, the substrate 10 is dried. Third, the substrate 10 is cleaned by argon plasma cleaning 10. The substrate 10 is retained on a rotating bracket 50 in a vacuum chamber 60 of a magnetron sputtering coating machine 100. The vacuum level of the vacuum chamber 60 is adjusted to about 8.0×10-3 Pa. Pure argon is fed into the vacuum chamber 60 at a flux of about 300 sccm (Standard Cubic Centimeters per Minute) to 600 sccm from the gas inlet 90, and a bias voltage is applied to the substrate 10 in a range from −300 to −800 volts for a time of about 2-8 minutes. The substrate 10 is washed by argon plasma, to further remove the grease or dirt. Thus, an adhesive force between the substrate 10 and the bonding layer 20 is enhanced.

Step 3 deposits the bonding layer 20 on the substrate 10. The temperature in the vacuum chamber 60 is adjusted to 100~200° C.; argon is fed into the vacuum chamber 60 at a flux from about 100 sccm to 300 sccm from the gas inlet 90, preferably at about 150 sccm; the speed of the rotating bracket 50 is adjusted to about 0.5 to 4 rpm (revolution per minute), preferably at about 3 rfm; a power source applied to a nickel titanium alloy target 70 may be in a range from bout 7 to 11 kw, preferably about 10 kw; a bias voltage applied to the substrate 10 may be in a range from −100 to −300 volts for a time of about 20 to about 60 min, to deposit the bonding layer 20 on the substrate 10. The nickel titanium alloy contains nickel in a range from about 20 to about 80 wt %.

Step 4 deposits the nano-composite layer 31 on the bonding layer 20. Nitrogen is fed into the vacuum chamber 60 at a flux from about 100 sccm to about 300 sccm from the gas inlet 90. Acetylene gas is fed into the vacuum chamber 60 at a flux from about 10 sccm to about 300 sccm from the gas inlet 90. The nickel titanium alloy target and a pure titanium target 80 in the magnetron sputtering coating machine are alternatively evaporated using a power from 7 kw to 11 kw for a time from about 30 min to about 60 min, to alternatively deposit a number of NiTiCN layers 3111 and a number of TiCN layers 3113 on the bonding layer 20.

The color layer 33 may be deposited on the nano composite base 31 to improve the appearance of the article 40.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a substrate;
   a bonding layer deposited on the substrate; and
   a coating deposited on the bonding layer, the coating including a nano-composite layer, the nano-composite base comprising an equal number of alternating nickel-titanium carbonitride layers and titanium carbonitride layers.

2. The article as claimed in claim 1, wherein each nickel-titanium carbonitride layer has a thickness ranging from about 10 nanometers to about 20 nanometers; each titanium carbonitride layer has a thickness ranging from about 10 nanometers to about 20 nanometers.

3. The article as claimed in claim 1, wherein the coating has a thickness ranging from about 1 micrometer to about 4 micrometers.

4. The article as claimed in claim 1, wherein the coating further comprises a color layer covering on the nano-composite base, to decorate the appearance of the coating.

5. The article as claimed in claim 1, wherein the substrate is made of high speed steel, hard alloy, or stainless steel.

6. The article as claimed in claim 1, wherein the bonding layer is a nickel titanium layer, the bonding layer has a thickness ranging from about 0.05 micrometer to about 0.2 micrometer.

7. The article as claimed in claim 1, wherein the chemical stability of the bonding layer is between the chemical stability of the substrate and the chemical stability of the coating, and the coefficient of thermal expansion of the bonding layer is between the the coefficient of thermal expansion of the substrate and the coefficient of thermal expansion of the coating.

8. A method for manufacturing an article comprising the steps of:
   providing a substrate, wherein the substrate is made of high speed steel, hard alloy, or stainless steel;
   depositing a bonding layer on the substrate by magnetron sputtering, wherein the bonding layer is a nickel titanium layer; and
   depositing a nano-composite base on the bonding layer, wherein the nano-composite base comprises an equal number of alternating nickel-titanium carbonitride layers and titanium carbonitride layers.

9. The method of claim 8, wherein during depositing a bonding layer on the substrate, the substrate is retained in a vacuum chamber of a magnetron sputtering coating machine; a power source applied to a nickel-titanium alloy target is in a range from about 7 to 11 kw; argon is fed into the vacuum chamber 60 at a flux from about 100 sccm to 300 sccm; a bias voltage applied to the substrate is in a range from −100 to −300 volts for a time of about 20 to 60 min, to deposit the bonding layer on the substrate.

10. The method of claim 8, wherein a nitrogen is fed into the vacuum chamber 60 at a flux from about 100 sccm to about 300 sccm and an acetylene gas is fed into the vacuum chamber 60 at a flux from about 10 sccm to about 300 sccm; a nickel-titanium alloy target and a pure titanium target in the magnetron sputtering coating machine are alternatively evaporated in a power from 7 kw to 11 kw for a time from 30 min to 60 min, to alternatively deposit a number of nickel-titanium carbonitride layers and a number of titanium carbonitride layers on the bonding layer.

\* \* \* \* \*